United States Patent [19]

Nibby, Jr. et al.

[11] Patent Number: 4,523,313
[45] Date of Patent: Jun. 11, 1985

[54] PARTIAL DEFECTIVE CHIP MEMORY SUPPORT SYSTEM

[75] Inventors: Chester M. Nibby, Jr., Peabody; Reeni Goldin, Somerville; Timothy A. Andrews, Arlington, all of Mass.

[73] Assignee: Honeywell Information Systems Inc., Waltham, Mass.

[21] Appl. No.: 450,846

[22] Filed: Dec. 17, 1982

[51] Int. Cl.³ .................. G06F 11/20; G11C 13/00
[52] U.S. Cl. ............................. 371/10; 365/200; 364/200
[58] Field of Search ............ 364/200, 900; 371/10; 365/200

[56] References Cited

U.S. PATENT DOCUMENTS

| | | | |
|---|---|---|---|
| 3,434,116 | 3/1969 | Anacker | 371/10 |
| 4,093,985 | 6/1978 | Das | 364/200 |
| 4,150,428 | 4/1979 | Jorig et al. | 371/10 |
| 4,355,376 | 10/1982 | Gould | 371/10 |
| 4,426,688 | 1/1984 | Moxley | 365/200 |
| 4,441,170 | 4/1984 | Folmsbee et al. | 371/10 |
| 4,450,559 | 5/1984 | Bond et al. | 371/10 |
| 4,460,997 | 7/1984 | Harns | 371/10 |

OTHER PUBLICATIONS

Smith, G. H. et al., "Substitute Memory Location Locator", IBM Tech. Disclosure Bulletin, vol. 12, No. 9, Feb. 1970.
Smith, G. H. et al., "Substitute Memory Location Assignment for Faulty Locations", IBM Tech. Disclosure Bulletin, vol. 12, No. 9, Feb. 1970.
Beau Soleil, W. F., "Utilization of Defective Memory Chips by Substituting Redundant Words for Defective Words", IBM Tech. Disclosure Bulletin, vol. 15, No. 6, Nov. 1972.
Lloyd, R., "The Case for Using Partially-Good Memory Devices", Computer Design, Apr. 1977.
Donaldson, J., "Partial RAMS Can Fill Today's Memory Boards", Electronics, Jan. 17, 1980.

Primary Examiner—Jerry Smith
Assistant Examiner—Michael R. Fleming
Attorney, Agent, or Firm—Faith F. Driscoll; Nicholas Prasinos

[57] ABSTRACT

A memory controller includes a partial defective bulk random access memory having a number of word locations constructed from a plurality of bit wide chips containing a predefined small number of random row or column faults. System columns of chips are organized into a plurality of groups, each group providing a different predetermined portion of the number of word locations. A defect-free memory system having substantially less capacity is similarly organized. Both memories couple to a static memory which stores column addresses associated with good memory locations and slice bit codes specifying the operational status of corresponding bit groups of word locations within both memories. During operation, read/write control circuits read and write valid words from group of bit locations from locations of both memories specified by slice bit codes.

30 Claims, 10 Drawing Figures

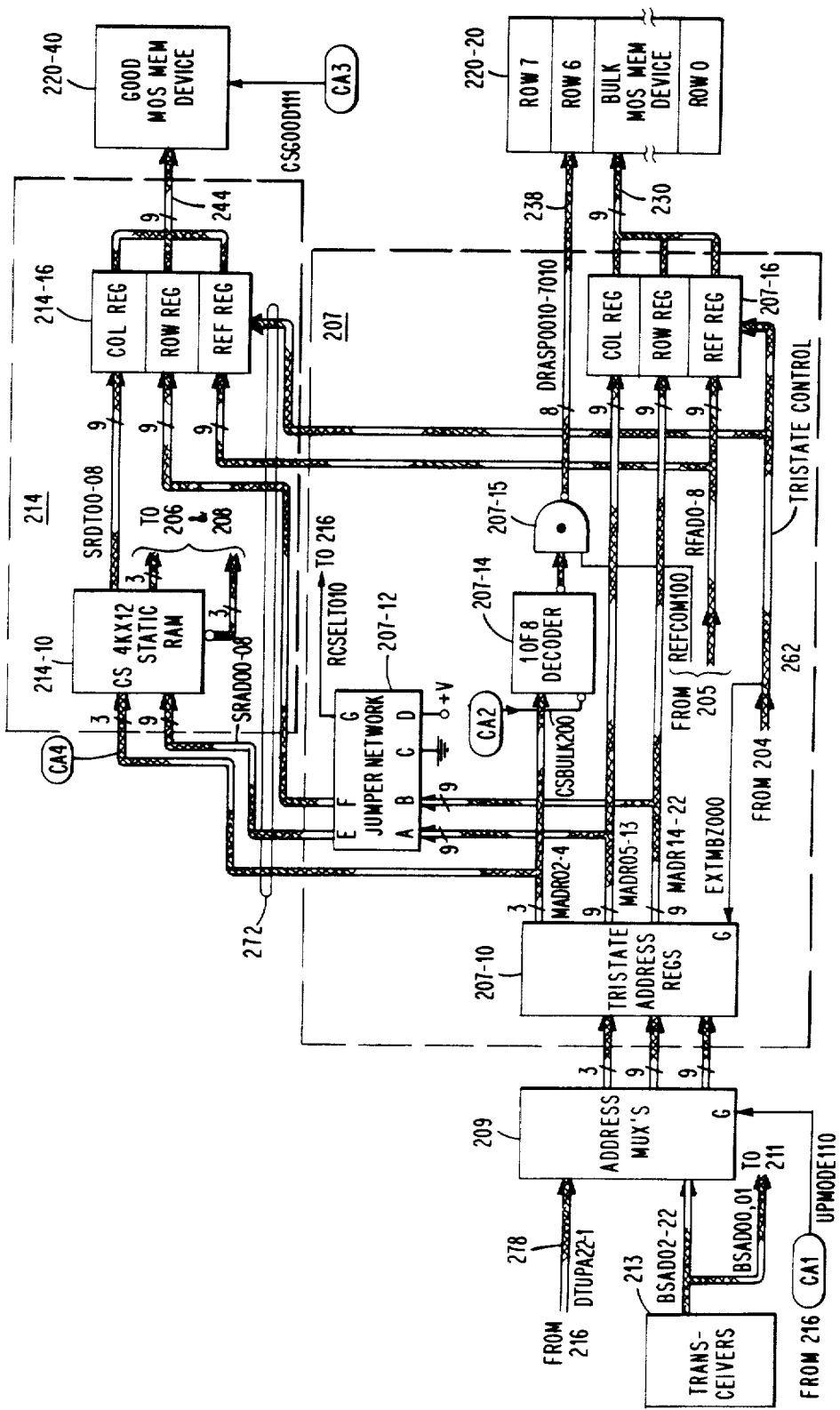

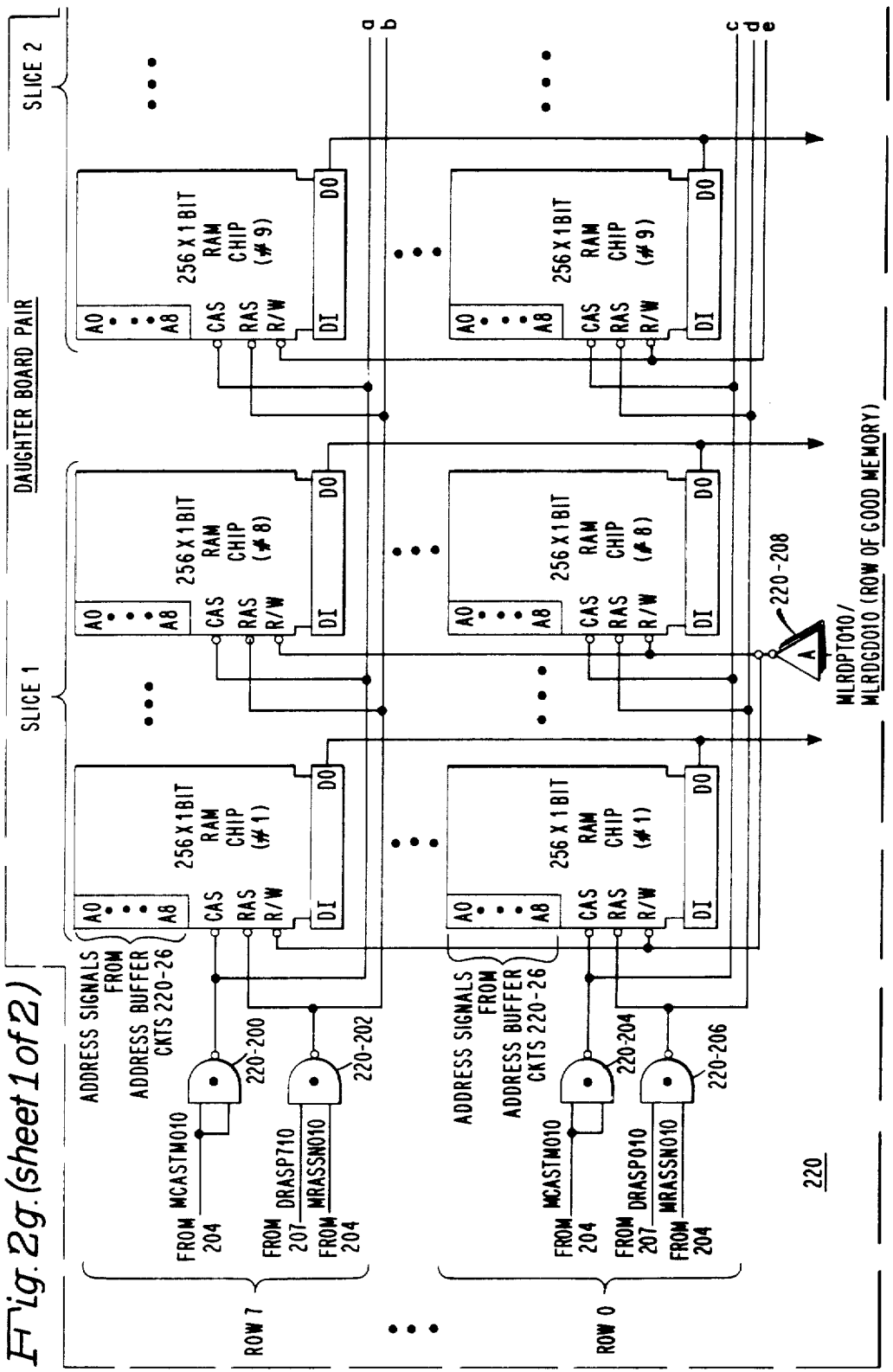
Fig. 2g. (sheet 1 of 2)

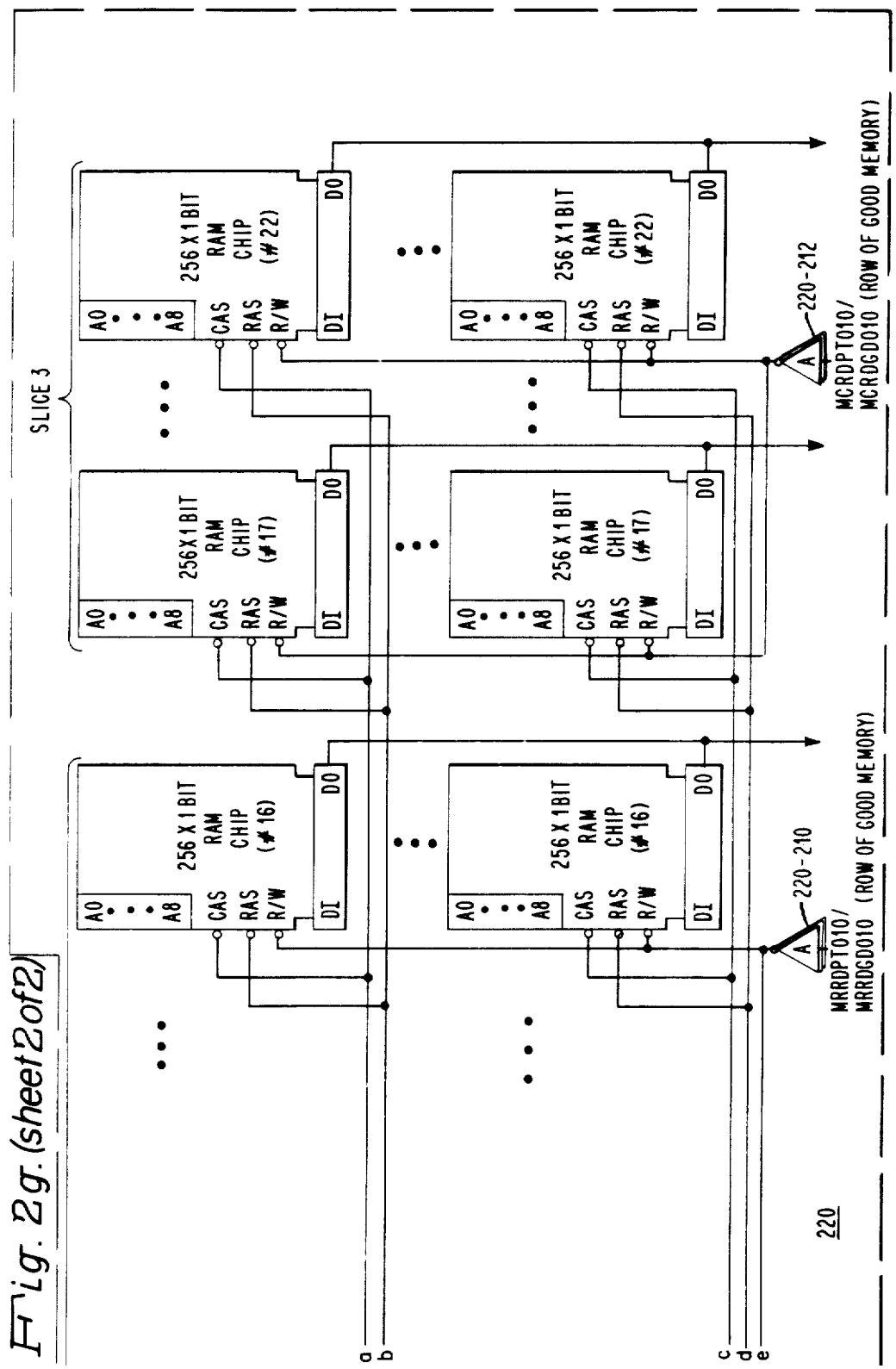
Fig. 2g. (sheet 2 of 2)

PARTIAL DEFECTIVE CHIP MEMORY SUPPORT SYSTEM

RELATED PATENT APPLICATIONS

1. "Remap Method and Apparatus for a Memory System which Uses Partially Good Memory Devices", invented by Chester M. Nibby, Jr., Reeni Goldin and Timothy A. Andrews, Ser. No. 06/450,691, filed on Dec. 17, 1982 with this application and assigned to the same assignee as named herein.

BACKGROUND OF THE INVENTION

1. Field of Use

This invention relates to semiconductor memories and more particularly to partially defective random access memories (RAMs).

2. Prior Art

For a number of years, different techniques have been employed which use memories with known defects. Early techniques involved the use of content addressable memories for locating the locations containing bad bits within the memory and enabling its replacement with good locations from another memory.

To reduce cost and speed up memory operations, one scheme disclosed in U.S. Pat. No. 3,434,116 circumvented bad memory cells of a bulk memory using replacement and read only memories having very small storage. The arrangement divided the word lines of the bulk memory into a large number of subword cell groups and substituting alternate subgroups in a replacement memory.

With advances in memory technology, techniques have been implemented that use memory components with known defects in the manufacture of memory systems. One technique involved the use of partially good memory chips/components in which at least three quarters of the memory array is known to be good. In this case, four different types of partially good chips are mixed with each type having one of its four quadrants containing defects. This technique is described in the article "The Case For Using Partially-Good Memory Devices" By Robert H. F. Lloyd, published in the April, 1977 issue of Computer Design.

Other techniques have employed partially good chips in which at least one-half of the memory array is known to be good. In this case, the memory system has to mix the appropriate amount of devices having good left and right halves to make a good working memory.

In order to produce partially good memory components with very high percentages of good cells, recently bulk devices containing at least two manufacturing defects in the array area have been proposed for use by one semiconductor manufacturer. The devices are of two types. A first type (type R) can contain up to a predetermined small number (e.g. 4,8) randomly distributed defective rows. The second type (type C) can contain up to the same predetermined number of defective columns and/or cells. Using this criteria of bulk device, a 64K memory component can contain 98 percent good cells.

The above criteria makes it possible to reduce the amount of additional storage for providing a good memory. The row or column defects within such memory components are random. Normally, in the failures in the row dimension are caused by metal opens resulting in less than a row being defective or by metal shorts resulting in two adjacent rows being shorted together. Therefore, in the case of two metal shorts/defects, there would be a loss of two rows per short or a total of four defective rows in a device. The majority of column failures result from an imbalance in the sense amplifier. This removes one column or results in one defective column. In the column dimension, there can be up to four defective sense amplifiers. A third type of defect that affects a bit could be dirt, a lattice defect or a mask defect. This type of failure could produce anywhere from one to four bit clusters, not necessarily near one another.

The article "Partial RAMs can fill today's memory boards" by Jerry Donaldson published in the Jan. 17, 1980 issue of Electronics describes a memory constructed from these types of partially good memory components. In the memory described, bit remapping hardware is employed and in operation when an address is given to the memory board, board logic included therein compares to those in a lookup table. When the address is there, an extra RAM is enabled. Data is written into or read from a row or column in the extra RAM corresponding to the address of a failing row or column in the partial bulk memory.

Another proposed scheme which utilizes bit mapping hardware requires that only double bit errors be remapped and that error detection and correction logic circuits included within the memory be used to correct single bit errors.

It has been found that the above schemes require a considerable amount of support logic circuits, such as bit remapping hardware. The result is that it becomes difficult and uneconomical to use a memory constructed from partially good chips within a conventional memory controller system. Also, such schemes as well as those previously discussed introduce delays in accessing data because of the need to perform comparison or replacement operations which lengthen memory cycle time. This in turn results in reduced memory performance.

A further disadvantage relates to decreases in fault tolerance produced by alpha particles or soft errors which can create double errors from single error faults.

Accordingly, it is a primary object of the present invention to provide a memory system constructed from partially good memory components which have few numbers of random defective rows or columns which has a minimum amount of support logic circuits.

It is a further object of the present invention to provide a memory controller system constructed from partially good memory components which minimizes memory access time and has high reliability.

SUMMARY OF THE INVENTION

The above objects and advantages of the present invention are achieved in a preferred embodiment of the memory controller system of the present invention. The embodiment includes a partially good memory good memory constructed from random access memory (RAM) chips, each having a predetermined small number of row or column faults distributed randomly. The chips are organized into numbers of system rows and columns. The system columns of chips are organized into groups wherein each group provides one portion of the total number of word locations in the memory. The memory system includes an addressable defect free memory constructed from RAM chips organized into at least one system row and the same number of system columns as the partially good memory.

The good or defect free memory columns of chips are organized into groups for providing assigned predetermined portions of up to the total number of memory word locations. Both memories couple to an addressable static random access memory having a small number of locations which store column addresses associated with locations in the good memory and slice bit codes specifying the operational status of corresponding groups of word locations within both memories.

During operation, memory read/write circuits initiate read or write memory cycles simultaneously within the partially good and good memories. During each such cycle, the static memory is addressed by a row or column address of a memory command for read out of a column address and slice bit code. This causes the location within the good memory specified by the command row address and static memory column address to be accessed simultaneously with a location within the partial memory specified by the memory command row and column addresses. Information is read from or written into the groups of bit locations of the pair of addressed locations within both memories specified by the slice bit code read from the static memory. The result is that with a small amount of additional support circuits, it is possible to construct a completely good memory system whose performance matches that of a memory system constructed entirely from good or error free memory components.

As explained above, the static memory stores column addresses independent of whether the partial memory is constructed from memory components having all defective rows or all defective columns. Therefore, the delay produced by accessing the static memory is offset or eliminated by the normal time differences in applying row and column addresses to the partially good and good memories. Accordingly, memory performance equals that of a completely good memory system.

Another feature of the present invention is that the static memory of the preferred embodiment is remapped for designating both single and double bit errors within a word location. The remapping is carried out dynamically by the microprogrammed apparatus described in related copending patent application referenced herein. It is carried out so as to completely fill each static memory location maximizing the utilization of the small storage capacity of the static memory. By remapping all of the defects within the memory system, the occurrence of any soft errors will now be treated as single bit errors by the memory error detection and correction circuits. This in turn results in increased reliability.

The novel features which are believed to be characteristic of the invention both as to its organization and method of operation together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 2a through 2g show in greater detail different sections of FIG. 1.

GENERAL DESCRIPTION OF PREFERRED EMBODIMENT

Figure 1:
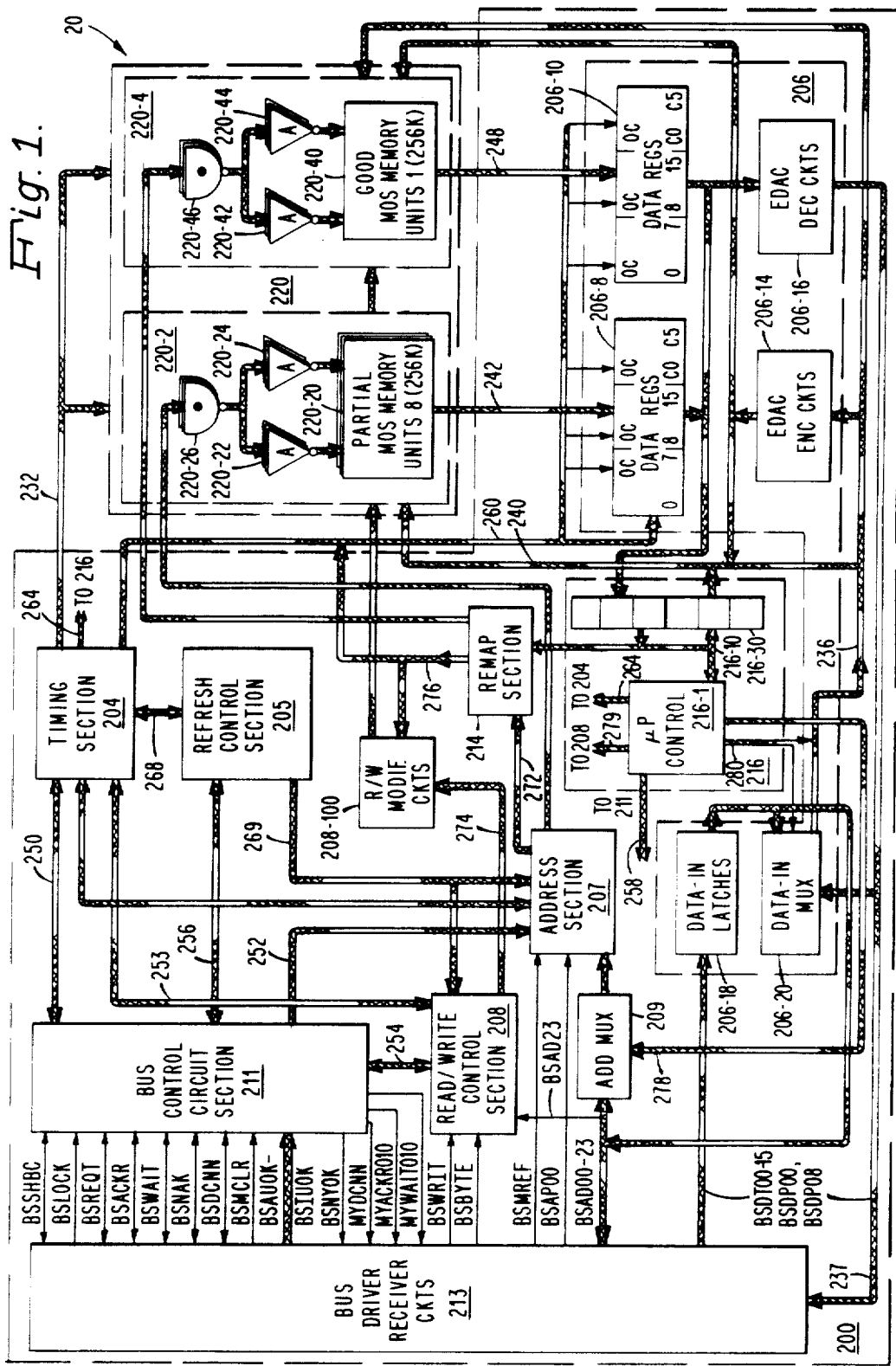
FIG. 1 shows in block diagram form a preferred embodiment of the memory system of the present invention.

FIG. 1 illustrates in block diagram form a preferred embodiment of a memory system constructed using the principles of the present invention. The memory system 20 connects to a system bus interface which includes the following lines: address lines (BSAD00-23, BSADP00), data lines (BSDT00-15, BSDP00, BSDP08), control lines (BSMREF, BSWRIT, BSBYTE, BSLOCK, BSSHBC and BSMCLR), handshake/timing lines (BSREQT, BSDCNN, BSACKR, BSWAIT, BSNAKR) and tie breaking network lines (BSAUOK, BSIUOK, BSMYOK). These lines will only be discussed herein to the extent necessary for an understanding of the operational principles of the present invention. However, for a more detailed description of the memory interface lines, reference may be made to U.S. Pat. No. 4,319,324.

Memory Section 220

As shown, memory system 20 includes a memory section 220 and a microprogrammed controlled controller section 200. The controller section 200 controls access to the four megabyte memory section 220 which includes a partial memory section 220-2 and a good memory section 220-4.

Partial Memory Section 220-2

The partial memory section 220-2 includes a bulk memory device 220-20 which has eight system rows of 256K RAM chips. According to the present invention, the chips of all system rows of device 220-20 are organized into three groups or slices which reduces significantly the amount of support circuits required as explained herein. The first two groups of 256K RAM chips each contain eight chips while the third group contains six chips. Collectively, the three groups provide two megawords of data storage, each word being 22 bits in length.

According to the preferred embodiment, each 256K chip can have up to eight randomly distributed row or eight column defects. This criteria is established by subjecting the chips to conventional testing as discussed in the Donaldson article. Normally, this function will be carried out by the semiconductor manufacturer. By using 256K RAM chips with the same type of defect (i.e., up to eight row or column defects) for the construction of device 220-20, chip yields can be increased substantially, lowering memory costs without any reduction in memory reliability as discussed herein.

The 256K RAM chips are mounted on two daughter boards as discussed herein, each daughter board having four system rows of chips. Each daughter board contains circuits for connecting memory section 220-2 to the different sections of the controller 200. More specifically, each board includes address buffer circuits which correspond to NAND gates 220-26 and inverter circuits 220-22 and 220-24. These circuits are connected to receive row, column and refresh address signals via a path 230 from an address section 207 of controller section 200. Also, each daughter board includes gating circuits for receiving decode signals from section 207 via path 238, timing signals via path 232 from section 204 and read/write control signals via a path 234 from read/write modification section 208-100 in accordance with the present invention. Input data signals are applied to each daughter board from either section 206 or section 216 via paths 236 and 240, respectively. Output data signals from each daughter board are applied to section 206 via a path 242.

Good Memory Section 220-4

As seen from FIG. 1, the good memory section 220-4 includes a good memory device 220-40 which has a single system row of 256K RAM chips. According to the present invention, the chips of memory device 220-40 are organized into three groups or slices as the 256K RAM chips of device 220-20.

The 256K RAM chips are mounted on a single daughter board. The daughter board contains circuits for connecting memory section 220-4 to the different sections of controller 200. More specifically, the daughter board includes address buffer circuits which correspond to NAND gates 220-46 and inverter circuits 220-42 and 220-44. According to the present invention, these circuits are connected to receive row, column and refresh address signals via a path 244 from a remap section 214.

Also, the daughter board includes gating circuits for receiving decode signals from section 207, timing signals via path 232 from section 204, and read/write control signals via path 234 from section 208. Similar to memory section 220-2, input data signals are applied to the daughter board of good memory 220-4 from either section 206 or section 216 via paths 236 and 240, respectively. Output data signals from the daughter board are applied section 206 via a path 248.

Controller Section 200

The controller section 200 includes those circuits required to generate memory timing signals, perform memory remap operations, perform refresh operations, data transfer operations, address distribution and decoding operations and bus interface operations. Such circuits are included as part of the different sections of FIG. 1.

The sections include a timing section 204, a refresh control section 205, a data control section 206, an address section 207, a read/write control section 208, a read/write modification section 208-100 a bus control circuit section 211, a bus driver/receiver circuit section 213, a remap section 214 and a microprocessing section 216.

The bus control section 211 includes the logic circuits which generate signals for generating and accepting bus cycle requests for single word fetch operations. As seen from FIG. 1, these circuits as well as the circuits of other sections connect to the driver/receiver circuits of section 213, conventional in design. The section 211 includes the tie breaking network circuits which resolve request priority on the basis of the memory system's physical position on the bus. It transmits or transmits and receives signals to and from sections 204, 207, 208 and 216 via paths 250, 252, 254, 256 and 258.

The timing section 204 includes circuits which generate the required sequence of timing signals for memory read and write cycles of operation. As seen from FIG. 1, this section transmits and/or receives signals to and from sections 205, 206, 207, 208, 211 and 216 via paths 258, 260, 262, 253, 250 and 264 respectively.

The address section 207 includes circuits which decode, generate and distribute address signals required for initialization and read/write memory selection. That is, section 207 provides row, column and refresh address signals to memory section 220-2 via path 230 as mentioned previously. Additionally, the same row, column and refresh address signals are applied to remap section 214 via a path 272, along with timing signals from section 204 from path 262. Section 207 applies row address decode signals to memory section 220-2 via path 238.

Section 207 receives address signals from lines BSAD08-BSAD23 and address lines BSAD00-BSAD07 and BSAP00, and section 216 via address multiplexer 209 and path 278, respectively, in addition to the memory reference control signal from the BSMREF line. Additionally, section 207 receives control and timing signals from section 204 via path 262.

The read/write control section 208 includes register and control logic circuits, conventional in design. The register circuits receive and store signals corresponding to the states of the BSWRIT, BSBYTE and control lines and the address line BSAD23. The section 208 receives input signals from sections 204, 205 and 211 via paths 252, 269 and 254, respectively. The control circuits decode the signals from register circuits and generate signals which are applied to sections 204, 208-100 and 211 via paths 253, 274 and 256, respectively. These signals are used to indicate the type of operation the system has been directed to perform, such as a read, write or a read followed by a write cycle of operation (i.e., for a byte command).

The read/write modification section 208-100 in accordance with the teachings of the present invention generates six read/write control signals, three of which are applied to the corresponding one of three groups of chips of partial and three of which are applied to one of three groups of good memory devices 220-20 and 220-40 via path 234. The first, second and third groups of chips of devices 220-20 and 220-40 correspond to left byte bits 1–8, right byte bits 9–16 and memory check bits 17–22. Section 208-100 receives a read command signal from section 208 via path 274 and a set of slice control signals from remap section 214 via path 276.

The refresh section 205 includes the circuits for periodically refreshing the contents of memory. Section 205 receives timing and control signals from sections 204 and 211 via paths 258 and 256, respectively. Section 205 provides control signals to sections 204, 207, 208 and 211 via paths 258, 269 and 256, respectively.

The data control section 206 includes data-in latches 206-18, a pair of tristate operand data registers 206-8 and 206-10 and a tristate data-in multiplexer circuit 206-20 with associated control circuits which enable data to be written from section 213 or from the memory devices 220-20 and 220-40 of section 220. For example, during a read cycle of operation, operand or instruction signals are read out from memory devices 220-20 and 220-40 into the output registers 206-8 and 206-10 and applied to section 213 via path 237. During a write cycle of operation, the byte operand signals are loaded into the data-in latches of block 206-18 from section 213, transferred via multiplexer 206-20 and written into section 220 memories.

The data control section 206 includes an error detection and correction circuits (EDAC) wherein each word contains 16 data bits and six check bits which are used to detect and correct single bit errors in the data words and detect and signal without correction, double bit errors in the data word. The EDAC circuits include EDAC encoder circuits 206-14 and EDAC decoder circuits 206-16. These circuits may take the form of those circuits disclosed in U.S. Pat. No. 4,072,853 which issued Feb. 7, 1978.

Data section 206 enables the return of identification information received from the data lines BSDT00-15 and data-in latches 206-18 via the address lines BSAD08-23.

Remap section 214 includes a remap memory and associated tristate register circuits which generate the necessary row, column and refresh address signals to be applied to good memory section 220-4 via path 244. Additionally, section 214 provides first, second and third complementary slice control signals which are applied to read/write modification section 208-100 via path 276 and to data output registers 206-8 and 206-10 via path 260.

As explained herein, the remap memory is constructed from 256K RAM chips. Since each chip of partial memory device 220-20 can have a maximum of eight defects randomly distributed, 64 good rows or columns are required for each 8-bit slice or group. For eight system rows of partially defective 256K RAM chips, 512 good rows or good columns are required ($64 \times 8$). Since each good 256K RAM chip is internally organized into 512 rows and 512 columns, mapping can be carried out by using all of the rows and columns within a good 256K RAM chip. It will be appreciated that if the criteria was less than eight, it would be possible to utilize a chip having less good rows and good columns such as a "half good" chip. The width of the remap memory is 12 bits which is large enough to provide the desired nine address bits for addressing good memory section 220-4 and the three slice bit control signals.

The preferred embodiment of the controller section 200 includes a microprocessor section 216. In addition to the different types of memory operations which can be performed under microprogram control, section 216 is allocated the function of performing the dynamic mapping involving remap section 214. Such mapping takes place upon power up and leaves the memory system 20 in an initialized state.

As seen from FIG. 1, section 216 includes a microprocessor control unit 216-1 and the plurality of tristate processor data registers of block 216-100. Microprocessor control unit 216-1 includes a central processing unit (CPU) which has a microprocessor memory section, a clock generator, a bus controller and bus transceivers. As discussed herein, these units can be implemented using standard chips manufactured by semiconductor companies, such as Intel Corporation, etc. For example, the CPU can be constructed from an 80286 integrated circuit chip, the clock generator from an 82284 chip, the bus controller from an 82288 chip and transceivers from 74LS245 chips.

The CPU chip of block 216-1 connects through bus transceiver circuits to a split data bus 216-10 which in turn connects to the data registers of block 216-100. Bus 216-10 connects to remap section 214 which enables the CPU of block 216-1 to test and load the remap memory of section 214.

Additionally, the CPU connects into the controller section address lines BSAD00-23 through address multiplexer circuit 209 via path 278. By controlling multiplexer circuit 209, address section 207 receives address signals from either section 213 or microprocessor section 216. Section 216 also provides control signals to section 211 via path 258 for inhibiting access to memory system 20 by a user program during remap operations. Other control signals are provided to read/write control section 208 and timing section 204 via paths 279 and 264, respectively. This enables the CPU to control read/write operations and initiate memory cycles during remap operations.

The CPU of block 216 provides input data to memory via data bus 216-10, the data registers of block 216-100 and encoder 206-14. At the same time, the CPU of block 216-1 inhibits data-in multiplexer 206-20 and encoder 206-14 via path 280. This gives the CPU complete control over the data being furnished to memory section 220.

The CPU of block 216-1 receives data from memory section 220 via bus 216-10 and the data registers of block 216-100. Since for the purposes of remapping, the corrected data is not used, the uncorrected data from memory stored in registers 206-8 and 206-10 is applied to the processor data bus 216-10 along with the check bit signals.

DETAILED DESCRIPTION OF MEMORY SYSTEM 20

Only those sections which are believed necessary to an understanding of the present invention are described herein. For further information regarding the remaining sections, reference may be made to U.S. Pat. Nos. 4,319,324 and 4,185,323.

Section 204

Figure 2A:
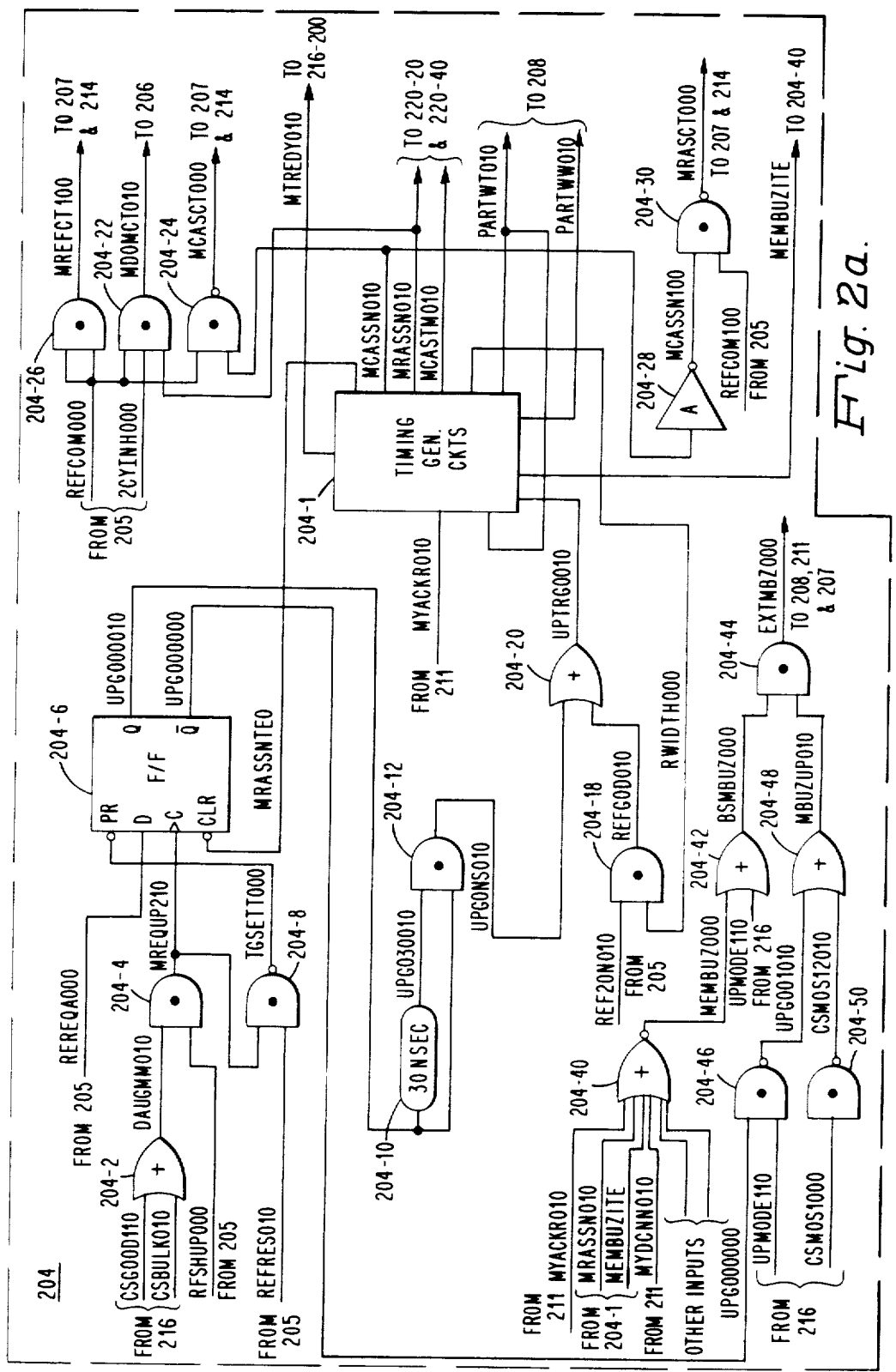

FIG. 2a illustrates in greater detail a portion of the timing circuits of section 204. The circuits shown generate the row and column address strobe signals MRASSN010 and MCATSM010 which are applied to memory devices 220-20 and 220-40. Additionally, the circuits generate timing signals MTREDY010, MDOMCT010, MCASCT000, MRASCT000 and MREFCT100 which are applied to the sections 206, 207, 214 and 216.

As seen from FIG. 2a, the timing generator circuits of block 204-1 generate a sequence of timing signals in response to the signal MYACKR010 from section 211 being switched to a binary ONE. These pulses establish the timing for the remaining sections during a memory cycle of operation.

In a similar fashion, the timing generator circuits of block 204-1 generate a sequence of timing signals in response to signal UPTRG0010 from microprocessor section 216 being switched to a binary ONE.

In greater detail, signals CSGOOD110 and CSBULK010, generated by section 216 and refresh cycle signal RFSHUP000 from section 205, are combined in an OR gate 204-2 and an AND gate 204-4 to produce microprocessor memory request signal MREQUP210 which is applied to a clock (C) input terminal of a D-type flip-flop 204-6. In the absence of a refresh request from section 205, signals REREQA000, REFRES010 and RFSHUP000 are a binary ONE, ZERO and ONE, respectively. Therefore, a toggle set signal TGSETT000, applied to a preset (PR) terminal of D-type flip-flop 204-6, generated by a NAND gate 204-8, remains a binary ONE. The result is that signal MREQUP210 switches flip-flop 204-6 to a binary ONE.

Signal UPG000010 at the binary ONE output terminal of flip-flop 204-6 is applied directly and indirectly through a 30 nanosecond delay circuit 204-10 to an AND gate 204-12. The resulting signal UGONS010 is applied to an OR gate 204-20 to force signal UPTRG0010 to a binary ONE conditioning the timing generator circuits 204-1 to generate the desired sequence of timing signals. Also, signal UPTRG0010 is forced to a binary ONE by an AND gate 204-18 in response to timing signal RW1DTH000 from generator circuits 204-1 when refresh signal REF20N010 is forced to a binary ONE by section 205.

The timing signals PARTWT010 and PARTWW010, generated during byte write operations for initiating an additional sequence of timing pulses, are applied to the circuits of section 208 along with signal UPG000000 from flip-flop 204-6. An AND gate 204-22 combines timing signal MRASSN010 with signals REFCOM000 and 2CYINH000 to generate signal MDOMCT010. Signal MDOMCT010 is applied to the gate (G) input terminals of the data registers of blocks 206-8 and 206-10 of section 206. An AND gate 204-24 combines timing signal MCASSN010 with refresh signal REFCOM000 to generate signal MCASCT000. Signal MCASCT000 is applied to the OC control terminals of the column address registers of sections 207 and 214. Also, AND gate 204-30 combines signal MCASSN010 after being inverted by an inverter circuit 204-28 with signal REFCOM100 in an AND gate 204-30 to generate signal MRASCT000. Signal MRASCT000 is applied to the OC control terminals of the row address registers of sections 207 and 214. A last control signal MREFCT100 is generated from signal REFCOM000 via an AND gate 204-26. Signal MREFCT100 is applied to the OC control terminals of the refresh address registers of sections 207 and 214. Signals MRASSN010 and MCASTM010 are applied to the row address strobe (RAS) and column address strobe (CAS) input terminals of all of the daughter boards containing good memory devices 220-40 and partial memory devices 220-20.

A further timing signal MEMBUZ1TE, generated by the circuits 204-1, is applied to a NOR gate 204-40 together with timing signal MRASSN010 and bus control signals MYACKR010 and MYDCNN010, in addition to other signals (not shown) from section 211. The NOR gate 204-40 is operative to generate memory busy signal MEMBUZ000 which an OR gate 204-42 and an AND gate 204-44 combines with signals UPMODE110 and MBUZUP010 to generate external memory busy signal EXTMBZ000. The binary ONE state of signal MBUZUP010 indicates when microprocessor section 216 is busy performing a read or write cycle of operation. This signal is generated by a pair of NAND gates 204-46 and 204-50 combining the pairs of signals UPG000000, UPMODE110 and CSMOS1000, and ORing the resulting signals UPG001010 and CSMOS12010 in an OR gate 204-48. Signal EXTMBZ000 is applied to the gate G input terminal of the address register 207-10 of section 207, to the read/write circuits of section 208 and to the circuits of section 211. Timing pulse MTREDY010 generated by timing generator circuits 204-1 occurs at the end of the timing sequence and is used to notify the microprocessor section 216 that it is the end of a memory cycle.

Sections 208 and 208-100

Figure 2C:
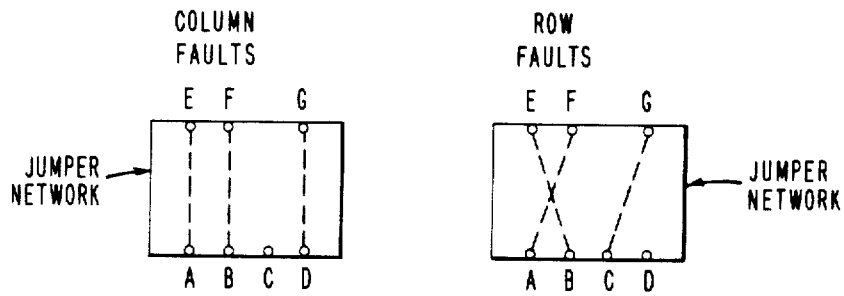
Figure 2D:
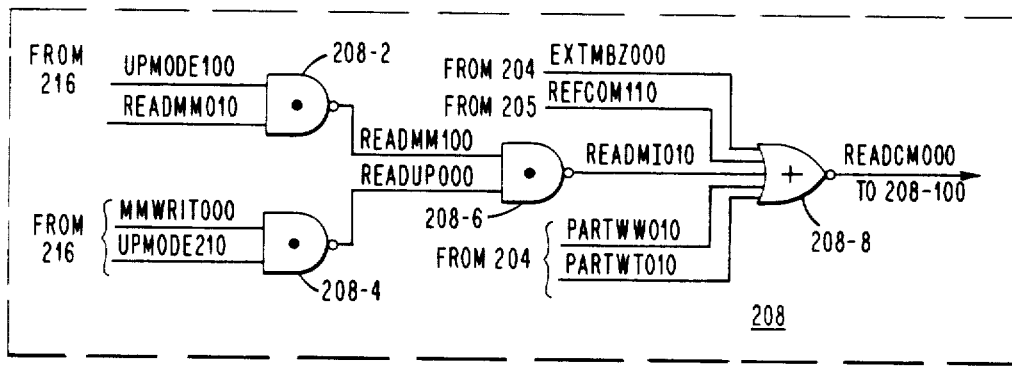
Figure 2A:
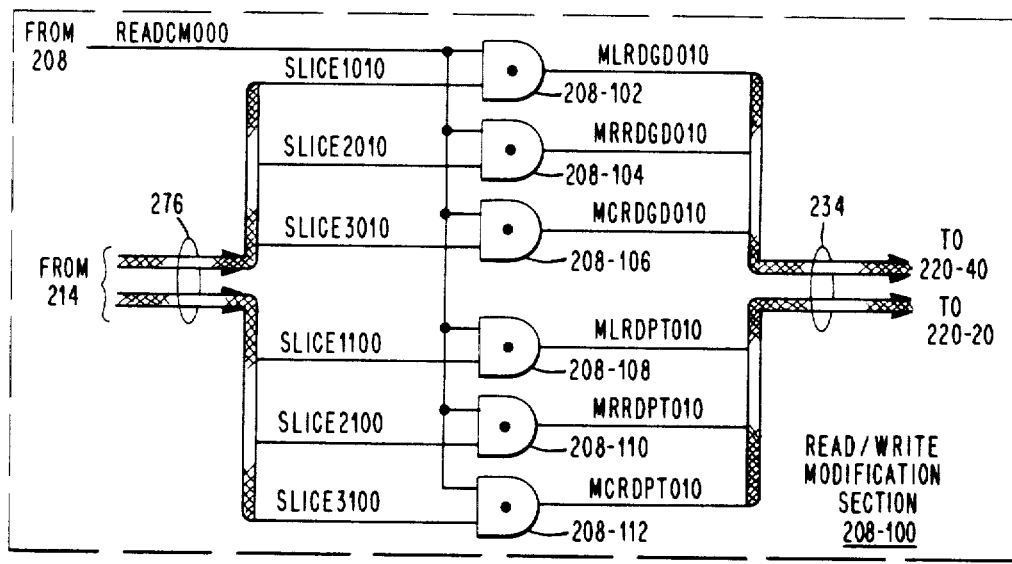

FIGS. 2d and 2e, respectively, illustrate in greater detail a portion of read/write control section 208 and read/write modification section 208-100. The circuits of section 208 generate the read command signal READCM000 in response to signals REFCOM110, PARTWW010, EXTMBZ000 and PARTWW010. The signal is applied to the circuits of section 208-100.

In greater detail, a NAND gate 208-2 generates signal READMM100 by combining microprocessor mode signal UPMODE100 and a read memory command signal READMM010 from a command register, not shown, which stores the states of signals BSWRIT, BSBYTE and BSAD23 received from bus transceiver circuits of block 213.

Similarly, a NAND gate 208-4 generates signal READUP000 by combining signal UPMODE210 and microprocessor memory write signal MMWRIT000. The signals MMWRIT000 and READMM100 are combined in a NAND gate 208-6 which generates read memory signal READMI010. A NOR gate 208-8 in response to any one of the signals READMI010, EXTMBZ000, REFCOM110, PARTWW010 and PARTWT010 being forced to a binary ONE forces read command signal READCOM000 to a binary ZERO to initiate a memory read cycle of operation.

Section 208-100 includes two sets of AND gates 208-102 through 208-112. Each of the gates is connected to receive as one input, read command signal READCM000. Each of the first set of AND gates 208-102 through 208-106 is connected to receive a different one of the three slice bit signals SLICE1010 through SLICE3010 generated by section 214. Each of the second set of AND gates 208-108 through 208-112 is connected to receive a different one of the complementary three slice bit signals SLICE1100 through SLICE3100 generated by section 214.

Each of the output signals MLRDGD010, MRRDGD010 and MCRDGD010, generated by one of the AND gates 208-102 through 208-106, is applied to a different one of the groups of 256K RAM chips of good memory device 220-40. Similarly, each of the output signals MLRDPT010, MMRDPT010 and MCRDPT010 generated by one of the AND gates 208-108 through 208-112 is applied to the same different one of the groups of 256K RAM chips of partial memory device 220-20. These sets of signals are inverted and applied to the read/write terminals of the 256K RAM chip groups as discussed herein. Thus, these signals specify whether or not the 256K RAM chip is to perform a read or write cycle of operation.

Address Path—Sections 207 and 214

FIG. 2b illustrates in greater detail those portions of section 207, 214 and 216 involved in the transfer and generation of addresses according to the teachings of the present invention. Additionally, the Figure indicates the source of control address signals by the designation CA followed by a numerical value. These signals have section 216 as their source.

It is seen that section 207 has microprocessing section 216 and the bus which connects to the driver/receiver circuits (constructed from 26S10 chips) of section 213 as address sources. Under the control of a control address (CA1) signal UPMODE110 from section 216, address multiplexer circuits 209 constructed from 74S257 chips, selectively apply address signals DTUPA22-UPA1 and BSASD02-22 to their output terminals. The selected address signals are loaded into tristate controlled registers 207-10 constructed from 74S373 chips. The registers 207-10 which are gated under control of signal EXTMBZ000 from section 204 permit the freezing of the address signals applied to memory section 20. The bus address signals BSAD00 and BSAD01 are applied to module identification circuits of section 211.

Figure 3:
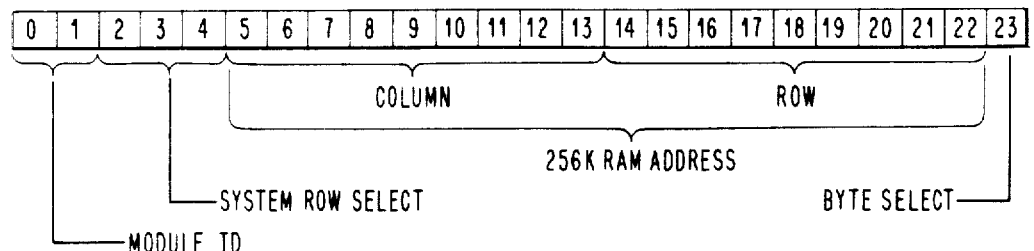
FIG. 3 shows the format of the memory command addresses applied to the memory system of FIG. 1.

As shown, different portions of the address signals are applied as inputs to a jumper network 207-12 and to a 1 of 8 decoder circuit 207-14 constructed from a 74S138 chip. The address format for the different portions of the address signals such as bus address signals BSAD02-22 is shown in FIG. 3. The state of signal BSAD23 defines which byte left or right is being modified during a byte write operation while the next 18 address signals BSAD5-22 define the particular bit location within each 256K RAM chip of partial memory device 220-20. That is, address signals BSAD14-22 are used to specify the row within each chip while address signals BSAD5-13 are used to specify the column within each chip. Bus address signals BSAD02-04 specify the system row of chips within device 220-20 while bus address signals BSAD00-01 are used to identify which memory controller/module of memory system is being addressed (e.g. system 20). The bus address signals are applied to section 211 and are decoded by circuits contained therein. It will be appreciated that the address signal DTUPA22-UPA1 have the same address format as signals BSAD02-22.

Accordingly, the address signals MADR02-4 applied to decoder circuit 207-14 are decoded by a 1 of 8 decoder circuit 207-14 which receives an enabling signal CA2/CSBULK200 from section 216. Each of the eight decoder output signals is applied to a different one of eight NAND gates of block 207-15 which receive refresh signal REFCOM100 from section 205. The resulting decoded row address signals DRASP0010-7010 are applied to the eight system rows of 256K RAM chips of device 220-20. The row address signals MADR14-22 are applied to a first set of inputs designated as B of jumper network 207-12 and to a row address register within a set of three tristate controlled registers of block 207-16 constructed from 74S373 type chips. The column address signals MADR05-13 are applied to a second set of inputs designated as A of jumper network 207-12 and to a column address register within the set of registers of block 207-16. The last register of the set of registers is connected to receive refresh address signals RFAD0-8 from section 205.

The different output terminals of the set of registers 207-16 are connected in a wired OR arrangement for enabling the multiplexing of row, column and refresh address signals onto path 230. Such multiplexing is accomplished by controlling the states of signals MRASCT000, MCASCT000, and MREFCT100, respectively, applied to the output control (OC) input terminals of the row, column and refresh registers. That is, when signal MRASCT000, MCASCT000 or MREFCT100 is in a binary ONE state, this inhibits any address signals from being applied to the output terminals of the corresponding register.

The jumper network 207-12 permits the use of 256K RAM chips with either row faults or column faults in memory device 220-20. The wiring configuration of jumper network for row and column faults is shown in FIG. 2c. When jumper network 207-12 is configured for 256K RAM chips having only column faults, it is seen that the column address signals MADR05-13 applied to inputs A appear at a set of outputs E and are fed to the address input of static RAM memory 214-10 of remap section 214. The row address signals MADR14-22 applied to inputs B appear at a set of outputs F and are fed as an input to the row address register of a set of tristate controlled registers 214-16 of section 214. This set of registers is connected in the same manner as the registers of block 207-16 for multiplexing row, column and refresh addresses onto path 244 for addressing the 256K RAM chips of good memory device 220-40.

When jumper network 207-12 is configured for 256K RAM chips having only row faults, it is seen that the column address signals MADR05-13 applied to inputs A, appear at outputs F and are fed as inputs to the good memory row address register. The row address signals MADR14-22 applied to inputs B, appear at outputs E and are fed to the address inputs of static RAM 214-10. It will be noted that in the case of row faults, the column address signals MADR05-13 now serve as the row address of the good memory device 220-40. This ensures that there is no loss in memory performance in determining the location of defective rows in bulk memory device 220-20 notwithstanding the type of defective chips used in constructing partial memory device 220-20.

Figure 2F:
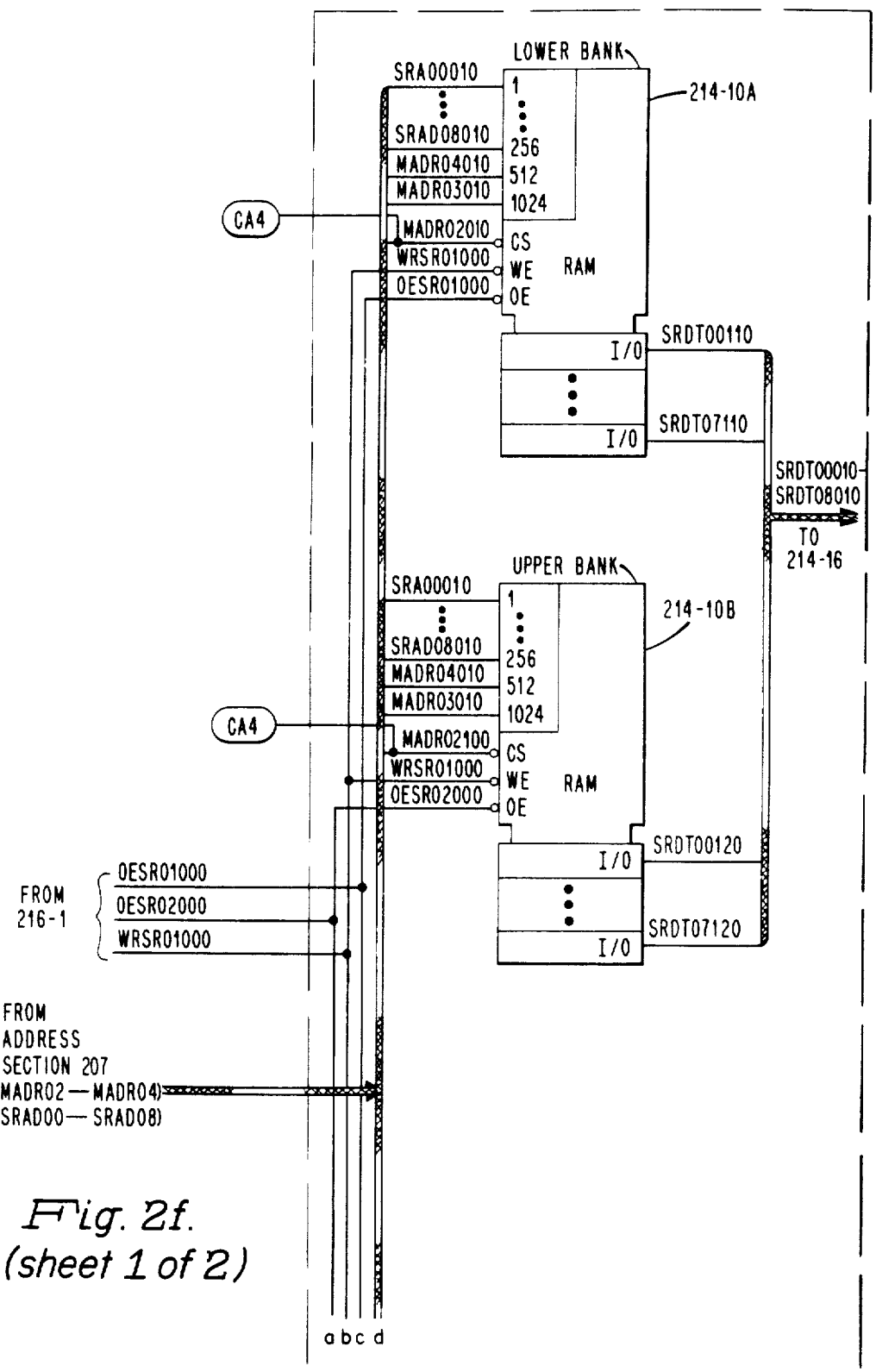
Figure 2F:
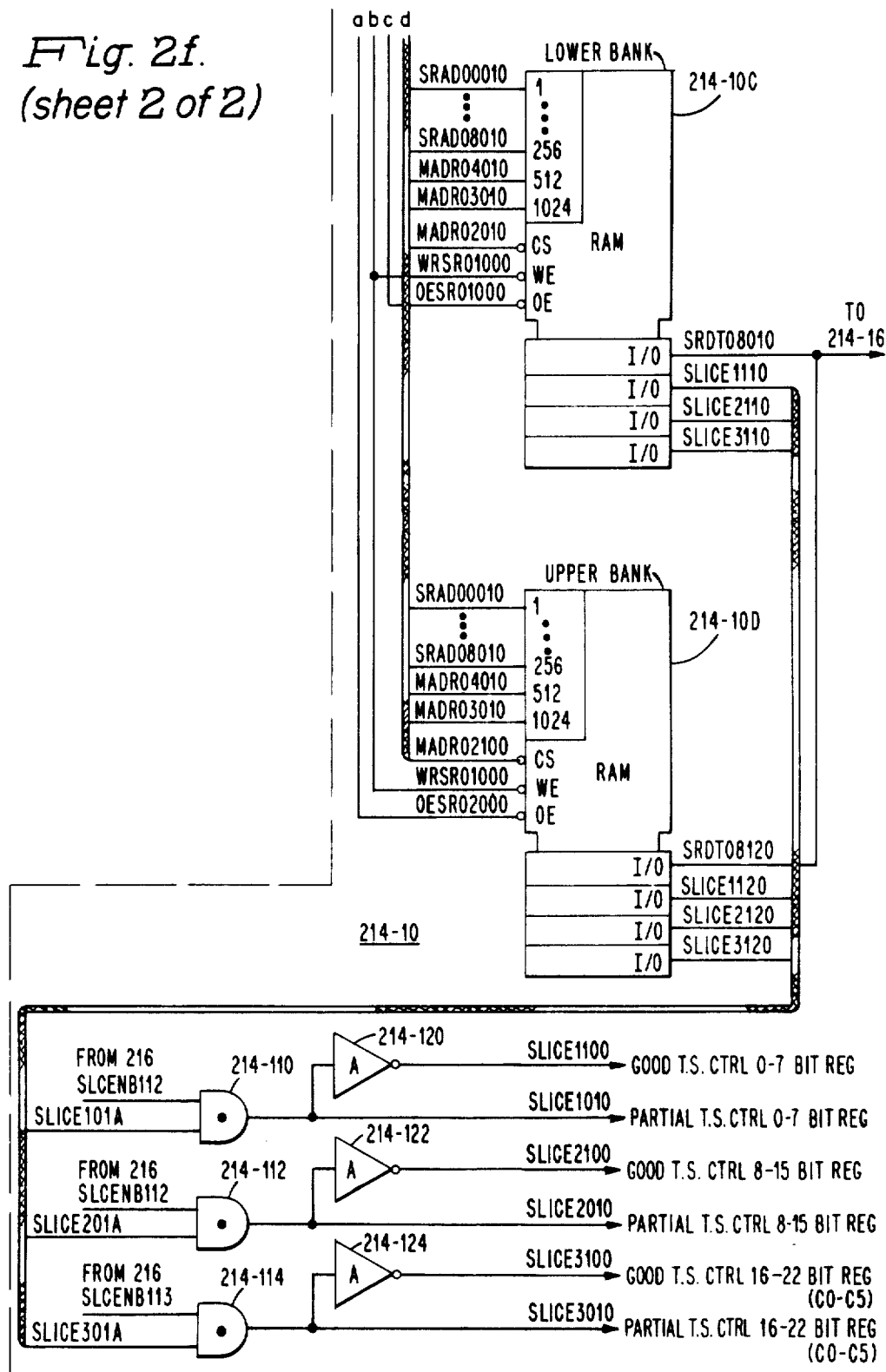

As explained herein, static RAM 214-10, shown in greater detail in FIG. 2f, is used to generate nine translated column address signals and three slice control signals. The column address signals are applied to the column address register of block 214-16. The refresh address register receives refresh address signals RFAD0-8 from section 205. Also, signals MRASCT000, MCASCT000 and MREFCT100 from section 204 are applied to the output control (OC) terminals of the row, column and refresh address registers of section 214. The selected row, column or refresh address from one of the registers of block 214-16 is applied via path 244 to good memory device 220-40. Additionally, good memory device 220-40 receives a row address decode signal CA3/CSGOOD111 from section 216.

It is also seen from FIG. 2b that jumper network 207-12 includes inputs C and D and an output G. The network 207-12 is additionally configured in the case of column faults to connect output G to a voltage +V. For row faults, output G connects to ground. The output G corresponds to row/column select signal which is used by microprocessing section 216 to establish whether or not partial memory device 220-20 has row or column faults. When the R/C select signal RCSELT010 is a binary ONE, the partial memory contains 256K RAM chips with column faults. The binary ZERO state of the R/C select signal RCSELT010 indicates that the partial memory contains 256K RAM chips with row faults.

Section 214

FIG. 2f shows in greater detail, the remap memory section 214 of the present invention. As seen from the Figure, the remap section 4, 2,048×8 bit RAM chips designated as HM6116 receive nine address signals SRAD00010-08010 from the jumper network outputs E together with three system row address select signals MADR04010-02010. The address signals MADR04010 and MADR03010 are applied to the most significant address input terminals while address signal MADR02010 and its complement signal MADR02100 are applied to the chip select (CS) terminals of the pairs of chips for the selection of the lower and upper bank of chips.

The I/O terminals of chips 214-10A and 214-10B are wire ORed together to provide the first eight address signals SRDT00010-07010 which feed good memory device 220-40. Additionally, the chip I/O terminals couple to section 216 via the microprocessor data bus 216-10. The ninth address signal SRDT08010 is provided by chips 214-10C and 214-10D, in addition to the slice bit signals SLICE101A through SLICE301A. Again, the I/O terminals of the chips are wire ORed together and connect to section 216 via data bus 216-10. It will be noted that only one-half of the number of bits of chips 214-10C and 214-10D are utilized leaving room for expansion.

Each of the slice bit signals SLICE101A through SLICE301A is applied to a different one of three AND gates 214-110 through 214-114. The first two slice bit signals SLICE101A and SLICE201A are "anded" with a control enable signal SLCENB112 from section 216. The third slice bit signal SLICE301A is "anded" with a control enabled signal SLCENB113 from section 216.

During normal operation, signals SLCENB112 and SLCENB113 are both binary ONES. The resulting signals SLICE1010 through SLICE3010 are inverted by inverter circuits 214-120 through 214-124. also, during normal operation, both control signals MMWRIT000 and CSMOS1000 from section 216 are normally binary ONES which effectively disconnects the chips from data bus 216-10. The set of slice bit signals SLICE1010 through SLICE3010 and their complement set of slice bit signals SLICE1100 through SLICE3100 are applied to sections 206 and 208.

Section 220

FIG. 2g shows in greater detail, the partial memory daughter board arrangement of the present invention. The Figure shows two daughter boards, each containing four system rows of 256K RAM chips, each row having 22 chips. As shown, the chips are organized into three groups. The first group of eight chips have their R/W terminals connected to receive read/write signal MLRDPT010 via a pair of inverter circuits 220-208 (i.e., one for each daughter board) from section 208-100. The second group of eight chips have their R/W terminals connected to receive read/write signal MRRDPT010 via a pair of inverter circuits 220-210. The third group of six chips have their R/W terminals connected to receive read/write signal MCRDPT010 via a pair of inverter circuits 220-212.

Additionally, each chip receives the set of nine address signals from section 207 via circuits 220-26. The column address strobe timing signal MCASTM010 generated by the circuits of section 204 is applied to the CAS terminals of the chips of each system row via a NAND gate (e.g. gates 220-200 and 220-204). The row address strobe timing signal MRASSN010 is applied to the RAS terminals of the chips of each system row via a NAND gate (e.g. gates 220-202 and 220-206). Additionally, each NAND gate is connected to receive an appropriate one of the row decode signals from section 207 (i.e., signals DRASP0010 through DRASP7010).

The data input and data output terminals of all of the chips of the same columns of partial memory device 220-20 are connected in common (wired ORed). The data input terminals of all rows of 256K RAM chips connect in common, while only the data output terminals of each group connect in common feeding the different data registers of block 206-8 of FIG. 1.

The daughter board arrangement of good memory section 220-4 is organized similar to section 220-2. The differences are that there are only a single system row of 22, good 256K RAM chips which receive the same address, column and row address strobe signals as section 220-2. However, the NAND gate connected to receive row address strobe signal MRASSN010 receives row enable decode signal CSGOOD111 from section 216. In accordance with the teachings of the present invention, the three groups of chips receive a different set of read/write signals from section 208-100. That is, the first group of eight chips have their R/W terminals connected to receive read/write signal MLRDG010. The second group of eight chips have their R/W terminals connected to receive read/write signal MRRDGD010. The third group of chips have their R/W terminals connected to receive read/write signal MCRDGD010. The data input and output terminals of the 256K RAM good memory chips connect to the different data registers of block 206-10 of FIG. 1.

DESCRIPTION OF OPERATION

Figure 4:
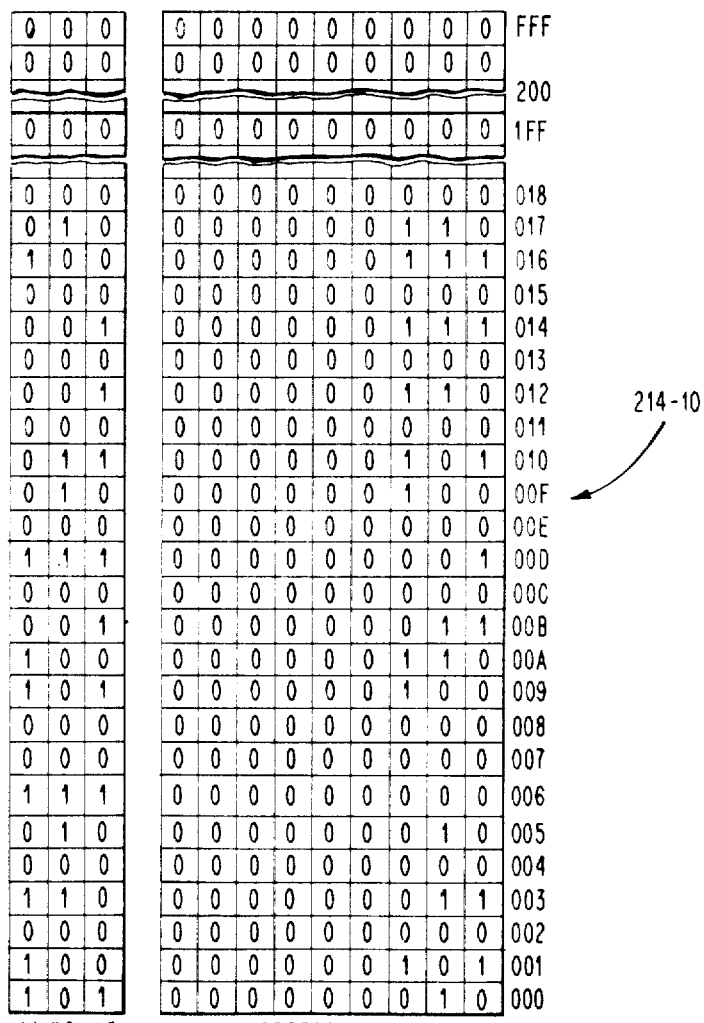
FIG. 4 shows an example of how the static remap memory section of FIG. 1 maps column or row defects according to the present invention.

The operation of the memory system of the present invention will now be described with reference of FIGS. 1-4. For purposes of simplicity, it will be assumed that microprocessor section 216 has completed its mapping of static memory 214-10 based upon its testing of partial memory device 220-20. The result is assumed to be as shown in FIG. 4. More specifically, the "ones" in the slice bit field of the Figure indicate the groups of memory locations in partial memory device 220-20 having failures. The column address value in each address field corresponds to the assigned column address of a location in good memory device 220-40 for a column or row fault.

While the remap static memory 214-10 has 4,096 locations, only the first 17 locations of the first 512 locations are shown. This illustrates the column/row faults of the first system row of 256K RAM chips of FIG. 2g. There are seven other segments of 512 locations within remap static memory 214-10 for designating column or row faults within the remaining seven system rows of 256K RAM chips.

The hexadecimal addresses on the right side of FIG. 4 designate physical column address portions of the input memory addresses in the case of column faults and physical row address portions of the input memory addresses in the case of row faults. It will be noted that each of the slices must not exceed the established criteria 512 (i.e., 8 faults per chip × 8 chips per slice × 8 system rows) as indicated by the number of "ONES" in each column of the slice bit field.

First, the operation of the present invention will be described to read and write memory cycles of operation in response to memory commands specifying partial memory locations having faults in one or more groups or slices of bit locations. It is assumed that partial memory device 220-20 is constructed from 256K RAM chips having only defective columns. Thus, the jumper network 207-12 of FIG. 2b is wired according to the left-hand drawing of FIG. 2c.

For the purpose of this discussion, the circuits and paths associated with microprocessor section 216 can be ignored, since these are used or active only during initialization at which time the contents of remap static memory 214-10 are established. Hence, it can be assumed that the different control address signals CA1–CA3 of FIG. 2b and the control data signals CD13 of FIG. 2f which have as their source section 216 have the following states: (1) CA1=0; CA2=0; CA3=1; and CD13/WRSR0 1000=1. Signals CD13/OESR01000 and OESR02000 are switched as a function of memory address bit 2 as discussed herein. Accordingly, section 216 is effectively disconnected from the system 20 and the remainder of the system is enabled for normal operation. For further information regarding the mapping operation performed by microprocessing section 216, reference may be made to the copending related patent application of Chester M. Nibby, Jr., Reeni Goldin and Timothy Andrews.

A first memory command specifying the read out of partial memory location in the first system row (i.e., bits 2–4=0) and having a column hexadecimal address equal to 006 and a row hexadecimal address of 000. That is, column address bits 5–13 of the memory address of FIG. 3 have the value "000000110" while row address bits 14–22 have the value "000000000". The memory command results in the switching of signal MYACKR010 to a binary ONE. This causes the timing generator circuits of block 204-1 to generate a series of timing signals for carrying out a memory cycle of operation. Certain ones of these signals cause the column address bits 5–13 and row address bits 14–22 to be stored in the first system row of 256K RAM chips.

The storage of these address bits is accomplished in two operations. In the first operation, the nine row address bits 14–22 specifying one of the 512 internal rows of storage locations within a system row of 256K RAM chips are applied to the partial memory row address register of block 207-16 and to good memory row address register of block 214-16 via jumper network 207-12. In response to timing signal MRASCT000 from timing generator circuits of block 204-1, the row address bits 14–22 are applied via paths 230 and 244 and address buffer circuits 220-26 and 220-46 of FIG. 1 to the input terminals A0–A8 of the 256K RAM chips of the eight system rows of FIG. 2g.

The system row select address bits 2–4 are decoded by decoder circuit 207-14 which results in one of NAND gates 207-15 forcing signal DRASP0010 to a binary ONE indicating the selection of system row 0. Signal DRASP0010 together with row address strobe signal MRASSN010 causes NAND gate 210-206 to force its output terminal to a binary ZERO. This in turn forces the RAS terminals of the partial memory 256K RAM chips of system row 0 to binary ZEROS which clocks the row address bits 14–22 into storage circuits internal to the partial memory chips.

Simultaneously therewith, signal MRASSN010 together with enable signal CSGOOD111 cause the corresponding NAND gate of the good memory device 220-40 to force its output terminal to a binary ZERO. This forces the RAS terminals of the good memory system row of 256K RAM chips to binary ZEROS. The result is that row address bits 14–22 are clocked into the chip's internal storage circuits.

Next, the 9-column address bits 5–13 are clocked into the 256K RAM chips of all eight system rows. Since the column address is applied later in time than the row address, the delay in generating an appropriate column address to be applied to good memory device 220-40 is absorbed by the difference in RAS and CAS timing. More specifically, the column address bits 5–13 of the memory command are applied via jumper network terminals A and E to the address input terminals of chips 214-10A through 214-10D of section 214 in FIG. 2f. Since system row select address bit 2 is a binary ZERO, the lower bank of static memory chips 214-10A and 214-10C of section 214 are enabled via their CS input terminals by the binary ZERO state of signal MADR02010. At the same time, the binary ZERO state of memory address bit 2 forces chip output enable signal OESR01000 to a binary ZERO. This causes the column address field and slice bit field contents of location 006 of static memory chips 214-10A and 210-10C to be applied to the chip's I/O terminals.

The 9 all ZERO column address of the address field portion of storage location 006 which corresponds to signals SRDT00010-SRDT08010 is loaded into the good memory column address register of block 214-16. The column address bits 5–13 of the memory command are loaded into the partial memory column address register of block 207-16. Accordingly, when the timing generator circuits of block 204-1 force signal MCASCT010 to a binary ONE, the partial memory and good memory column address registers apply their respective column address contents via paths 230 and 224 and address buffer circuits 220-26 and 220-46 to the 0–8 address terminals of the partial memory 256K RAM chips of system rows 0–7 and the good memory system row of 256K RAM chips.

When the timing generator circuits of block 204-1 force column address strobe signal MCASTM010 to a binary ONE, each of NAND gates (e.g. gates 220-200 and 220-204) force its output to a binary ZERO which results in binary ZERO signals being applied to the CAS terminals of the partial memory 256K RAM chips of each system row. The result is that the memory column address bits 5–13 are clocked into the storage circuits within the partial memory chips of each system row.

Simultaneously therewith, signal MCASTM010 causes the corresponding NAND gate of the good memory device to force its output terminal to a binary ZERO. This forces the CAS terminals of the good memory system row of 256K RAM chips to binary ZEROS. The result is that the column address from location 006 of static memory 214-10 is clocked into the chip's internal storage circuits.

The row and column addresses condition the 256RAM chips of system row 0 of partial memory device 220-20 and good memory device 220-40 to access the contents of partial memory word location with hexadecimal address column and row portions of 006 and 000, respectively, and good memory word location with hexadecimal address column and row portions of 000 and 000, respectively. During the simultaneous accessing of both memories, the three slice bits read out from static memory location 006 are applied to AND gates 214-110 through 214-114 of FIG. 2f. Since slice enable signals SLCENB112 and SLCENB113 are binary ONES, the binary ONE slice bit signals SLICE101A through SLICE301A cause AND gates 214-110 through 214-114 to force slice bit control signals SLICE1010 through SLICE3010 to binary ONES. At the same time, inverter circuits 214-120 through 214-124 force the complementary slice bit control signals SLICE1100 through SLICE3100 to binary ZEROS.

Since the memory command specifies a memory read operation, the signal READMM010 from the memory command register (not shown) of section 208 is forced to a binary ONE. This causes NAND gate 208-2 to force signal READMM100 to a binary ZERO which results in signal READMI010 being forced to a binary ONE. In response to signal READMI010, NOR gate 208-8 forces read command signal READCM000 to a binary ZERO. Accordingly, the sets of AND gates 208-102 through 208-112 force signals MLRDG0010 through MCRDPT010 to binary ZEROS. These sets of signals are applied to the different groups or slices of 256K RAM chips of the partial and good memory devices 220-20 and 220-40. More specifically, these signals are applied via inverter circuits (e.g. circuits 220-208 through 220-212) of FIG. 2g) to the R/W terminals of the partial memory 256K RAM chips of system rows 0–7 and to the R/W terminals of the good memory system row of 256K RAM chips. The result is that the R.W terminals are forced to binary ONES conditioning the 256K RAM chips of both memories to perform a read cycle of operation.

The contents of the specified memory word locations in both memories are simultaneously read out and loaded into the data registers of blocks 206-8 and 206-10 of FIG. 1 in response to timing signal MDOMCT010 generated by the circuits of section 204. Under the control of the sets of slice bit signals and complementary slice bit signals, the appropriate data registers of blocks 206-8 and 206-10 are conditioned to apply their bit contents to output bus 237. Since all three slice bits of static memory location 006 are binary ONES indicating that all three groups of bit locations within the partial memory location are faulty, the 22-bit word contents applied to output bus 237 correspond to all three groups of bits of good memory location 0.

It will be appreciated that when there is less than three groups of bit locations having column faults, such as when the memory command causes location 001 of static memory 214-10 to be addressed, this causes the specified data registers of both blocks 206-8 and 206-10 to apply their bit contents to output bus 237. That is, the slice bit field pattern "100" of location 001 causes signal SLICE1010 to be forced to a binary ONE while signals SLICE2010 and SLICE3010 are forced to binary ZEROS. Accordingly, complementary signal SLICE1100 is forced to a binary ZERO while complementary signals SLICE2100 and SLICE3100 are forced to binary ONES. The set of slice control signals condition the data registers of block 206-8 to apply the contents of bit locations 8–22 to bus 237 while the set of complementary slice control signals simultaneously condition data registers of block 206-10 to apply the contents of bit locations 0–7 to bus 237.

Now, when the memory command is coded to specify a write operation, signal READMM010 is forced to a binary ZERO. This results in NOR gate 208-8 of FIG. 2d forcing read command signal READCM000 to a binary ONE. As seen from FIG. 2e, AND gates 208-102 through 208-112 as a function of the states of slice control signals SLICE1010 through SLICE3100 force read/write control signals MLRDGD010 through MCRDGD010 to binary ONES and MLRDPT010 through MCRDPT010 to binary ZEROS.

It is assumed that memory system 20 receives a write memory command having the same address as the first discussed read command. The all ONES slice bit field of location 006 of static memory 214-10 causes AND gates 208-102 through 208-106 to force good memory read/write command signals MLRDG0010 through MCRDGD010 to binary ONES. At the same time, AND gates 208-108 through 208-112 force partial memory read/write command signals MLRDPT010 through MCRDPT010 to binary ZEROS. From FIG. 2g, it is seen that none of the three groups of partial memory 256K RAM chips of system row 0 are conditioned to perform a write cycle of operation. However, all three groups of good memory 256K RAM chips are conditioned by the binary ONE states of signals MLRDGD010 to write the information word applied via data-in multiplexer 206-20 and path 236 into good memory device 220-40 at the location specified by the nine all ZERO column address furnished by static memory 214-10 and memory command row address bits 14–22.

When the addressed partial memory location contains less than three bit groups with column faults, the slice bit signals cause information to be written into groups of bit locations furnished by both memories. For example, assume that the write memory command causes location 001 of status memory 214-10 of FIG. 4 to be addressed. The slice bit field pattern "100" of location 001 results in signal SLICE1010 to be forced to a binary ONE while signals SLICE2010 and SLICE3010 are forced to binary ZEROS. Accordingly, complementary signal SLICE1100 is forced to a binary ZERO while complementary signals SLICE2100 and SLICE3100 are forced to binary ONES. Thus, AND gates 208-102 through 208-12 of Fig. 2e force read/write control signals MLRDGD010, MRRDPT010 and MCRDPT010 to binary ONES and signals MRRDGD010, MCRDGD010 and MLRDPT010 to binary ZEROS. From FIG. 2g, it is seen that the second and third groups of partial memory 256K RAM chips of system row 0 are conditioned to perform a write cycle of operation. Additionally, the first group of good memory 256K RAM chips is conditioned to perform a write cycle of operation.

Thus, bits 0–7 of the information word applied via data-in multiplexer 206-20 and path 236 are written into the first group of bit positions of the good memory location specified the 9-bit column address stored in location 001 furnished by static memory 214-10 and memory command row address bits 14–22. Bits 8–22 of the information word are written into the second and third group of bit positions of the partial memory location specified by the memory command column and row address bits 5–22.

It will be obvious from the above examples that different patterns of the slice bit fields indicating partial memory column faults read out from static memory 214-10 cause different combinations of groups of bit locations within partial and good memory devices 220-20 and 220-40 to be accessed and written into in response to memory read and write commands. Such memory operations are carried out at the same speed as conventional memories.

The above is also true when partial memory device 220-20 is constructed from 256K RAM chips having only defective rows. Thus, the jumper network 207-12 of FIG. 2b is wired according to the right-hand drawings of FIG. 2c. The result is that the row address bits 14–22 of a memory command are used to access the appropriate location within static memory 214-10 for read out of the column address field and slice bit pattern. While that is taking place, the memory command column address bits 5–13 are immediately loaded into the good memory row address register of block 214-16.

As discussed above, the column address is applied to the system rows of 256K RAM chips later in time than the row address. By switching row and column addresses via jumper network 207-12, which places static memory 214-10 in series with the good memory column address register path, the delay in generating or translating the appropriate column address to be applied to good memory device 220-40 is absorbed by the difference in RAS and CAS timing. The memory command row and column addresses are loaded into the partial memory row and column address registers of block 207-16 in the manner previously described.

The operation of memory system 20 proceeds as described above. The result is that the contents of an entirely good location made up of combinations of good and partial memory bit locations specified by the slice bit field pattern is read or written into as specified by the received memory command.

It is seen that independent of the type of partial memory device being used, the static memory delay is always in series with the column address path of the good memory device. Therefore, no matter where in partial memory device a defective row or column location is being accessed, the apparatus of the present invention enables access to an entirely good location within the same period of time it takes to access a conventional memory constructed from system rows of entirely good 256K RAM chips.

It will be obvious to those skilled in the art that many changes may be made to the preferred embodiment of the present invention without departing from its teachings. For example, the criteria of the number of row or column faults may be increased or decreased. Similarly, the size and organization of the memory system may be changed (e.g. double word memory). The teachings of the invention may be used with other than 256K RAM chips as well as with other types of storage devices.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. An addressable semiconductor memory system for providing a number of word locations for storing information words having a number of bits, said system comprising:

an addressable partially good memory including a plurality of partially good RAM chips, each chip having a number of internal rows and columns of bit locations containing a predefined small number of faults distributed randomly, said chips being organized into a number of system rows and columns, said number of system columns being organized into a number of groups, each group providing a different portion of said number of word locations;

an addressable good memory including a plurality of defect-free RAM chips, each chip being organized into said number of internal rows and columns of bit locations, said chips being organized into at least one system row and said number of system columns, said number of system columns being organized into said number of groups, each group providing an assigned portion of said number of word locations;

an addressable RAM static memory having a plurality of locations much less in number than said partially good memory, each location for storing a column address specifying one of said number of internal column locations in said good memory and a number of slice bit signals coded to specify the operating status of each of said number of groups of a corresponding word location in said partially good memory;

addressing means coupled to receive row and column address portions of a memory command, said address means being coupled to said partially good memory for applying said row and column address portions to said partially good memory, said addressing means including means coupled to said good and static memories, said means for selectively applying one of said memory command row and column address portions to said static memory for read out of said column address and said slice bit signals of one of said locations and the other one of said row and column address portions to said good memory and said good memory being coupled to receive said column address from said static memory; and, control means coupled to each of said memories, said control means being operative in response to said memory command specifying a memory write operation and said slice bit signals read out from said one location of said static memory to generate selectively control signals for simultaneously conditioning for writing, only those groups of chips in the system rows of said partially good and good memories specified by said coding of said slice bit signals, said specified groups of chips providing a defect-free word location composed of portions of said addressed good memory location and portions of said addressed partial memory location as specified by said coding of said slice bit signals.

2. The system of claim 1 wherein said system further includes:

first output register means to an output bus, to each of said partially good groups of chips and to said static memory for receiving signals corresponding to said slice bit signals; and second output register means coupled to said output bus in common with said first output register means, to each of said good group of chips and to said static memory for receiving signals corresponding to said slice bit signals; and said control means being operative in response to said memory command specifying a memory read operation to generate control signals for simultaneously conditioning each of said number of groups of chips in system rows of said partially good and good memories for read out to said first and second output register means and said first and second output register means being conditioned by said slice bit signals to transfer to said output bus only information received from those groups of chips in said system rows of said partially good and good memories specified by said coding of said slice bit signals providing said defect-free location.

3. The system of claim 2 wherein said addressing means includes:

a first set of row and column address registers coupled to said good memory for applying row and column addresses to said system rows of good chips, said column address register being coupled in series with said static memory for receiving said column address read out from said one location; and network switching means coupled to said static memory and to said row address register of said first set, said networking switching means being connected to selectively apply one of said memory row and column address portions to said static memory offsetting the delay in reading out said column address by the time difference in sequentially applying said row and column addresses stored in said first set of registers to said system row of good chips thereby maintaining the same performance for said partially good memory constructed from partially good chips having row or column faults.

4. The memory system of claim 3 wherein said network switching means includes:

first and second sets of input terminals connected to receive said column address and said row address portions respectively of said memory command;

first and second sets of output terminals connected to said static memory and to said row address registers respectively; and first and second sets of jumper conductor means for selectively connecting said sets of input terminals to said sets of output terminals in a predetermined manner for offsetting said delay.

5. The memory system of claim 4 wherein said first and second sets of input terminals respectively are wired to connect to said first and second sets of output terminals for said partially good chips having only column faults.

6. The memory system of claim 4 wherein said first and second sets of input terminals respectively are wired to connect to said second and first sets of output terminals for said partially good chips having only row faults.

7. The memory system of claim 2 wherein said addressing means further includes:

a second set of row and column address registers coupled to each of said plurality of groups of partially good chips for applying said row and column address portions of said memory command for reading from or writing into said groups simultaneously as a function of said slice bit signals.

8. The memory system of claim 1 wherein said first register output means includes:

a first set of registers coupled to said output data bus, said first set of registers corresponding in number to said number of groups, each of said first set of registers being coupled to a different one of said groups of said partially good RAM chips for receiving information signals therefrom and to said static memory for receiving a different one of said slice bit signals representative of said operation status of said different one of said groups; and and said second register output means includes a second set of registers coupled in common with said first set of registers to said output data bus, said second set of registers corresponding in number to said number of groups, each of said second set of registers being coupled to a different one of said groups of said good RAM chips and to said static memory for receiving a different one of said slice bit signals representative of said status of said different one of said groups, said numbers of registers of said first and second sets of registers being simultaneously conditioned by said slice bit signals to provide to said output bus, a valid information word composed of group bits read from those good and partial memory groups of bit locations defined by the coding of said slice bit signals.

9. The memory system of claim 8 wherein said first and second set of registers each has a control input terminal connected to receive said different one of said slice bit signals, said first and second sets of registers being conditioned by complementary sets of said slice bit signals applied to said control input terminals to read out to said output data bus specified corresponding groups of bits received from good and partial memory groups of bit locations.

10. The memory system of claim 8 wherein said first set of registers receive said slice bit signals and said second set of registers receive complementary slice bit signals, each of said slice bit signals when in a first state indicating a faulty group of partially good bit locations conditioning one of said first set of registers associated therewith to inhibit the transfer of its group of bit contents to said output data bus and the corresponding one of said complementary slice bit signals when in a second state complementary to said first state simultaneously conditioning one of said second set of registers associated therewith to transfer its group of bit contents to said output data bus enabling the replacement of said faulty group of partially good bit locations.

11. The memory system of claim 1 wherein said system further includes timing circuit means coupled to said groups of partial and good memory chips, said timing circuit means sequentially generating row address timing signals and column address timing signals for enabling the sequential application of said row and column addresses to said groups of said partially good and good memory chips for simultaneously accessing of a word location in said partially good and good memories.

12. The memory system of claim 1 wherein said control means includes first and second sets of gate circuits connected to said partially good chips and to said good memory chips respectively, each of said gate circuits being connected to receive a command signal indicating the type of operation specified by said memory command, each of said first and second sets of gate circuits being connected to receive a signal corresponding to different one of said slice bit signals and each of said first and second sets of gate circuits being conditioned by said command signal indicating that said system is to perform a memory write operation to condition for writing one of said groups of memory chips associated therewith for writing as a function of the state of said different one of said slice bit signals enabling a data word to be written into said valid memory location composed of those groups of bit locations specified by said slice bit signal contents.

13. An addressable semiconductor memory system for providing a number of word locations for storing information words having a number of bits, said system comprising:

an addressable partially good memory including a plurality of partially good RAM chips, each partially good chip having m number of internal rows and n number of internal columns of bit locations containing a predefined small number of row or column faults distributed randomly, said plurality of partially good chips being organized into X number of system rows and Y number of system columns, said Y columns of chips being organized into a small number of groups, each group providing one different predetermined portion of said number of word locations;

an addressable good memory having a plurality of defect-free chips, each good chip being organized internally into said m rows and said n columns of bit locations, said plurality of good chips being organized into at least one system row and said Y system columns, said Y columns of chips being organized into said small number of groups, each group for providing assigned predetermined portions of said number of word locations;

an addressable static random access memory coupled to said partially good and good memories, said static memory having a plurality of locations much less in number than said partially good memory, each location storing a column address coded to specify one of the internal n column locations within said good memory and a plurality of slice bit signals representative of the operational status of corresponding groups of a pair of word locations, one within each of said partially good and good memories;

addressing means coupled to said partially good memory, said good memory and to said static memory for selectively applying row and column address portions of a memory command to each of said memories; and, control means coupled to said partially good memory, to said good memory and to said static memory, said control means being operative in response to said memory command to generate signals for application to said partially good and good memories for performing a read or write memory cycle of operation simultaneously therein;

said addressing means applying said row or column address portions to said static memory for read out of the column address and slice bit signal contents of one of said locations, said good memory chips being conditioned by said signals to read from or write into those groups specified by said slice bit code contents of one of said good memory location specified by said row address portion applied by said addressing means and said column address contents of said static memory location and said partial memory chips being simultaneously conditioned by said signals to read from or write into those groups specified by said slice bit signal contents of one of said partial memory locations specified by said row and column address portions applied by said addressing means for providing a valid word location composed of those groups of bit locations of said partial and good memory locations specified by said slice bit signal contents.

14. The memory system of claim 13 wherein said addressing means includes:
a first set of row and column address registers coupled to said good memory for applying row and column addresses to said good memory said plurality of groups of RAM chips, said column address register being coupled in series with said static memory for receiving said column address therefrom; and, network switching means coupled to said static memory and to said row address register of said first set, said networking switching means being connected to selectively apply said row and column address portions of said memory command to said static memory to offset the delay in reading out said column address from said static memory by the time difference in sequentially applying said row and column addresses stored in said row and column registers to said good memory thereby maintaining the same performance for said partially good memory constructed with said partially good chips having either row or column faults.

15. The memory system of claim 14 wherein said network switching means includes:
first and second sets of input terminals connected to receive said column address and said row address portions respectively of said memory command;
first and second sets of output terminals connected to said static memory and to said row address registers respectively; and
first and second sets of jumper conductor means for selectively connecting said sets of input terminals to said sets of output terminals for offsetting said delay.

16. The memory system of claim 15 wherein said first and second sets of input terminals respectively are wired to connect to said first and second sets of output terminals for said partially good chips having only column faults.

17. The memory system of claim 15 wherein said first and second sets of input terminals respectively are wired to connect to said second and first sets of output terminals for said partially good chips having only row faults.

18. The memory system of claim 14 wherein said addressing means further includes:
a second set of row and column address registers coupled to each of said plurality of groups of partially good chips of partially good chips for applying said row and column address portions of said memory command for reading from or writing into said groups simultaneously as a function of said slice bit code contents.

19. The memory system of claim 13 wherein said system further includes:
a first set of registers coupled to an output data bus, said first set of registers corresponding in number to said number of groups, each of said first set of registers being coupled to a different one of said groups of said partially good RAM chips for receiving information signals therefrom and to said static memory for receiving a different one of said slice bit signals representative of said status of said different one of said groups; and
a second set of registers coupled in common with said first set of registers to said output data bus, said second set of registers corresponding in number to said number of groups, each of said second set of registers being coupled to a different one of said groups of said good RAM chips and to said static memory for receiving a different one of said slice bit signals representative of said status of said different one of said groups, said numbers of registers of said first and second sets of registers being simultaneously conditioned by said slice bit signals to provide to said output bus, a valid information word composed of group bits read from those good and partial memory groups of bit locations defined by the coding of said slice bit signals.

20. The memory system of claim 19 wherein said first and second set of registers each has a control input terminal connected to receive said different one of said slice bit signals, said first and second sets of registers being conditioned by complementary sets of said slice bit signals applied to said control input terminals to read out to said output data bus specified corresponding groups of bits received from good and partial memory groups of bit locations.

21. The memory system of claim 13 wherein said system includes timing circuit means coupled to said groups of partial and good memory chips, said circuit means sequentially generating row address timing signals and column address timing signals for enabling the sequential application of said row and column addresses to said groups of said partially good and good memory chips for simultaneous access of a word location in said partially good and good memories.

22. The system of claim 13 wherein said control means includes first and second sets of gate circuits connected to said partially good chips and to said good memory chips respectively, each of said gate circuits being connected to receive a command signal indicating the type of operation specified by said memory command, each of said first and second sets of gate circuits being connected to receive a signal corresponding to different one of said slice bit signals and each of said first and second sets of gate circuits being conditioned by said command signal indicating that said system is to perform a memory write operation to condition one of said groups of memory chips associated therewith for writing as a function of the state of said different one of said slice bit signals enabling a data word to be written into said valid memory location composed of those groups of bit locations specified by said slice bit signal contents.

23. A semiconductor memory system for providing access to a number of word locations for reading and writing information in response to read and write memory commands, each of said memory commands including a memory address portion containing row and column addresses, said system comprising:

a memory section including:
  an addressable partially good memory, including a plurality of partially good RAM chips, each partially good chip having m number of internal rows and n number of internal columns of bit locations containing a predefined randomly distributed small number of row or column faults distributed randomly, said plurality of partially good chips being organized into X number of system rows and Y number of system columns, said Y columns of chips being organized into a small number of gorups, each group providing one different predetermined portion of said number of word locations;
  an addressable good memory having a plurality of defect-free chips, each good chip being organized internally into said m rows and said n columns of bit locations, said plurality of good chips being organized into at least one system row and said Y system columns, said Y columns of chips being organized into said small number of groups, each group for providing assigned predetermined portions of said number of word locations; and, a controller section including:
  an addressable static random access memory coupled to said memory section, said static memory having a plurality of locations, each location storing a column address coded to specify one of the internal n column locations within said good memory and a plurality of slice bit signals representative of the operational status of corresponding groups of a pair of word locations, one within each of said partially good and good memories;
  addressing means coupled to said memory section and to said static memory for receiving row and column address portions of a memory command; and,
  control means coupled to said memory section and to said static memory, said control means being operative in response to said memory command to generate signals for application to each memory of said memory section for performing a read or write memory cycle of operation simultaneously therein;
  said addressing means applying said memory command row or column address portion to said static memory for read out of the column address and slice bit signal contents of one of said locations, said good memory chips being conditioned by said signals to read from or write into those groups specified by said slice bit signal contents of one of said good memory location specified by said memory command row address portion and said static memory column address and said partial memory chips being simultaneously conditioned by said signals to read from or write into those groups specified by said slice bit signal contents of one of said partial memory locations specified by said memory row and column address portions for providing a valid word location composed of groups of bit locations of said partial and good memory locations specified by said slice bit signal contents.

24. The system of claim 23 wherein m, n, x and y are whole number integers, and m equals n and x is less than y.

25. The system of claim 23 wherein m, n, x and y are whole number integers and m is less than n and x is greater than y.

26. The system of claim 23 wherein said predefined randomly distributed small number of row or column faults is small as compared to said m rows and n columns of said partially good chips.

27. The system of claim 23 wherein said addressing means includes:
  a first set of row and column address registers coupled to said good memory for applying row and column addresses to said system rows of good chips, said column address register being coupled in series with said static memory for receiving said column address read out from said one location; and
  network switching means coupled to said static memory and to said row address register of said first set, said networking switching means being connected to selectively apply one of said memory row and column address portions to said static memory offsetting the delay in reading out said column address by the time difference in sequentially applying said row and column addresses stored in said first set of registers to said system row of good chips thereby maintaining the same performance for said partially good memory constructed from partially good chips having row or column faults.

28. The system of claim 27 wherein said network switching means includes:

first and second sets of input terminals connected to receive said column address and said row address portions respectively of said memory command;

first and second sets of output terminals connected to said static memory and to said row address registers respectively; and first and second sets of jumper conductor means for selectively connecting said sets of input terminals to said sets of output terminals in a predetermined manner for offsetting said delay.

29. The system of claim 23 wherein said controller section further includes:

timing circuit means coupled to said groups of partial and good memory chips, said circuit means sequentially generating row address timing signals and column address timing signals for enabling the sequential application of said row and column addresses to said groups of said partially good and good memory chips for simultaneous access of a word location in said partially good and good memories.

30. The system of claim 23 wherein said control means includes first and second sets of gate circuits connected to said partially good chips and to said good memory chips respectively, each of said gate circuits being connected to receive a command signal indicating the type of operation specified by said memory command, each of said first and second sets of gate circuits being connected to receive a signal corresponding to different one of said slice bit signals and each of said first and second sets of gate circuits being conditioned by said command signal indicating that said system is to perform a memory write operation to condition one of said groups of memory chips associated therewith for writing as a function of the state of said different one of said slice bit signals enabling a data word to be written into said valid memory location composed of those groups of bit locations specified by said slice bit signal contents.

* * * * *